United States Patent
Lu et al.

(10) Patent No.: US 7,915,903 B2
(45) Date of Patent: Mar. 29, 2011

(54) BATCH-TEST METHOD USING A CHIP TRAY

(75) Inventors: Sheng-Feng Lu, Hsinchu (TW); Yu-Kun Hsiao, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 12/542,292

(22) Filed: Aug. 17, 2009

(65) Prior Publication Data

US 2009/0302875 A1    Dec. 10, 2009

Related U.S. Application Data

(62) Division of application No. 11/652,064, filed on Jan. 11, 2007, now Pat. No. 7,595,631.

(30) Foreign Application Priority Data

Jun. 9, 2006 (TW) .............................. 95120719 A

(51) Int. Cl.
*G01R 31/00* (2006.01)

(52) U.S. Cl. ......... 324/750.16; 324/750.22; 324/757.01; 324/759.03

(58) Field of Classification Search .......... 324/754–765, 324/158.1, 750.16
See application file for complete search history.

(56) References Cited

U.S. PATENT DOCUMENTS

| | | | |
|---|---|---|---|
| 4,856,904 A | 8/1989 | Akagawa | |
| 5,184,068 A | 2/1993 | Twigg et al. | |
| 5,313,156 A * | 5/1994 | Klug et al. | 324/158.1 |
| 5,484,062 A | 1/1996 | Rich | |
| 5,530,376 A * | 6/1996 | Lim et al. | 324/765 |
| 5,644,247 A * | 7/1997 | Hyun et al. | 324/755 |
| 5,708,222 A | 1/1998 | Yonezawa et al. | |
| 6,025,732 A * | 2/2000 | Foo et al. | 324/760 |
| 6,097,201 A | 8/2000 | Slocum | |
| 6,246,251 B1 | 6/2001 | Gallagher | |
| 6,297,654 B1 | 10/2001 | Barabi | |
| 6,339,321 B1 | 1/2002 | Yamashita et al. | |
| 6,407,563 B2 | 6/2002 | Ohtaki | |
| 6,492,825 B2 * | 12/2002 | Choi | 324/755 |
| 6,731,127 B2 | 5/2004 | Watts | |
| 6,853,209 B1 * | 2/2005 | Jovanovic et al. | 324/758 |
| 6,897,670 B2 | 5/2005 | Burns | |
| 6,949,942 B2 * | 9/2005 | Eldridge et al. | 324/765 |
| 7,102,217 B2 * | 9/2006 | Thurgood | 257/673 |
| 7,495,464 B2 * | 2/2009 | Miyazaki et al. | 324/765 |
| 2002/0011863 A1 | 1/2002 | Takahashi et al. | |
| 2004/0021479 A1 * | 2/2004 | Lin et al. | 324/765 |

FOREIGN PATENT DOCUMENTS

| | | |
|---|---|---|
| JP | 2001-007166 | 1/2001 |
| TW | 463274 | 11/2001 |
| TW | 1237858 | 8/2005 |

* cited by examiner

*Primary Examiner* — Ha Tran T Nguyen
*Assistant Examiner* — Richard Isla Rodas
(74) *Attorney, Agent, or Firm* — Muncy, Geissler, Olds & Lowe, PLLC

(57) ABSTRACT

A chip test method is disclosed and includes: loading chips on a chip tray and fastening a cover plate on the chip tray; loading the chip tray with the cover plate in a chip test device; aligning a probe card of the chip test device with a test unit of the chip tray; testing chips in the chip tray; sorting the passed chips from the failed chips.

16 Claims, 8 Drawing Sheets

BATCH-TEST METHOD USING A CHIP TRAY

CROSS REFERENCE TO RELATED APPLICATIONS

This application is a Divisional of U.S. patent application Ser. No. 11/652,064, filed Jan. 11, 2007 now U.S. Pat. No. 7,595,631 and entitled "WAFER LEVEL ASSEMBLE CHIP MULTI-SITE TESTING SOLUTION", which claims priority of Taiwan Patent Application No. 095120719, filed on Jun. 9, 2006, and the entirety of which are incorporated by reference herein.

BACKGROUND OF THE INVENTION

1. Field of the Invention

The invention relates to a test method, and more particularly to a batch-test method with a chip tray.

2. Description of the Related Art

Recently, there a need for more efficient semiconductor device testing processes has arisen. A semiconductor device is generally subject to a wafer test and a chip test before it is shipped to a user. The wafer test is performed in a wafer state, while the chip test is performed in a chip state after the wafer is diced, assembled and packaged. The wafer test and chip test are performed in order to prevent possible inflow of defective chips in an assembly process, i.e., in order to best reject possible defective chips in a chip state.

In a conventional chip test procedure, a specific chip test apparatus is required and the chip test apparatus cannot be shared to test different chips, thus, the test cost increases. Moreover, the present chip test apparatus cannot test a large number of chips at the same time, and the chips need to be manually delivered to the chip test apparatus to process testing procedure. The described test method and apparatus not only waste time, but increase the risk of shipping delay. Furthermore, automated test procedure and apparatus are major stream in the present day, thus, how to design a appropriate test procedure and apparatus to be compatible to different types of chip is the most desirable in the present day.

BRIEF SUMMARY OF THE INVENTION

Chip test methods are provided. An exemplary embodiment of a chip test method comprises: loading chips on a chip tray and fastening a cover plate on the chip tray; loading the chip tray with the cover plate in a chip test device; aligning a probe card of the chip test device with a test unit of the chip tray; testing chips in the chip tray; sorting the passed chips from the failed chips.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Probe cards have been used for testing electrical properties and circuit functions of semiconductor chips formed on a semiconductor wafer. Typically, testing is conducted in on semiconductor chips still in wafer form. The probe card is pressed against the wafer so that probes of the probe card contact corresponding electrode pads on the semiconductor chip. The probes of the probe card and an interconnection structure on the probe card thus provide connection between the semiconductor chip and a testing apparatus to which the probe card is connected.

Figure 1:
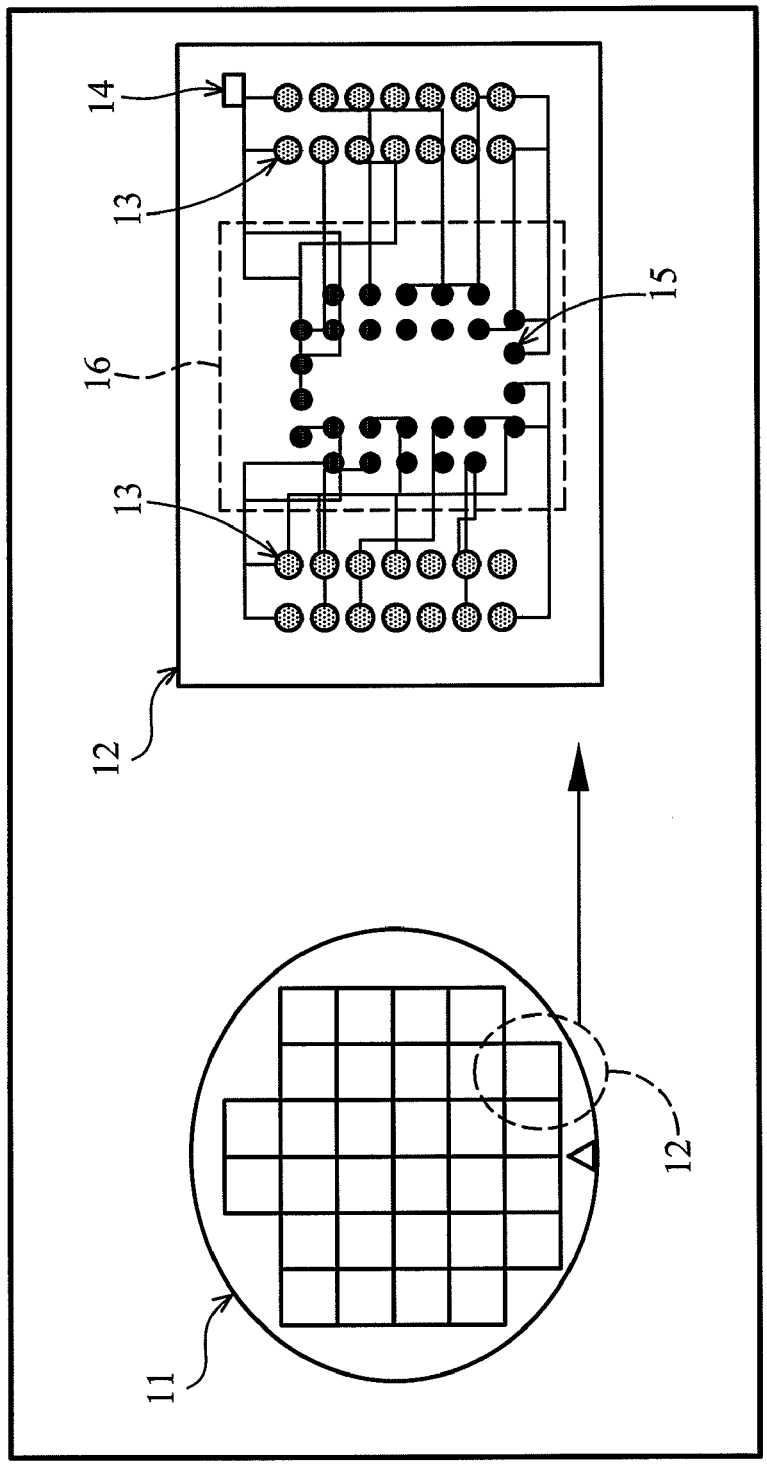
FIG. 1 is a schematic diagram showing an embodiment of a chip tray of the invention.

FIG. 1 is a schematic diagram showing an embodiment of a chip tray of the invention. The chip tray 11 comprises a plurality of test units 12 for loading chips. Each test unit 12 comprising a plurality of extension contact points 13, an alignment point 14 and a plurality of chip contact points 15 formed in a socket 16. In this embodiment, the chip contact points 15 of the test unit 12 are for BGA (Ball Grid Array) chip packages, those skilled in the art will recognize that the arrangement of the chip contact points 15 can be based on the package type of the chip, such as QFP (Quad flat Pack), PGA (Pin Grid Array) or others. When the chip is loaded on the socket 16, the extension contact points 13 is electrically connected to corresponding contact points of the chip (not shown in FIG. 1) via the conductive lines formed between the extension points 13 and the chip contact points 15. Thus, when a probe card (not shown in FIG. 1) tests the test unit, the probe card transmits at least one test signal to the test unit 12, and then receives the feedback signal to determine if the tested chip has passed or failed. Prior to the probe card testing of the chip, the probe card aligns with the test unit 12 based on the location of the alignment point 14. In this embodiment, the chip tray 11 cannot be compatible to all kinds of packaged chip, such as memory chip or video chip, i.e. the chip tray 11 is customized for specific chip.

Figure 2:
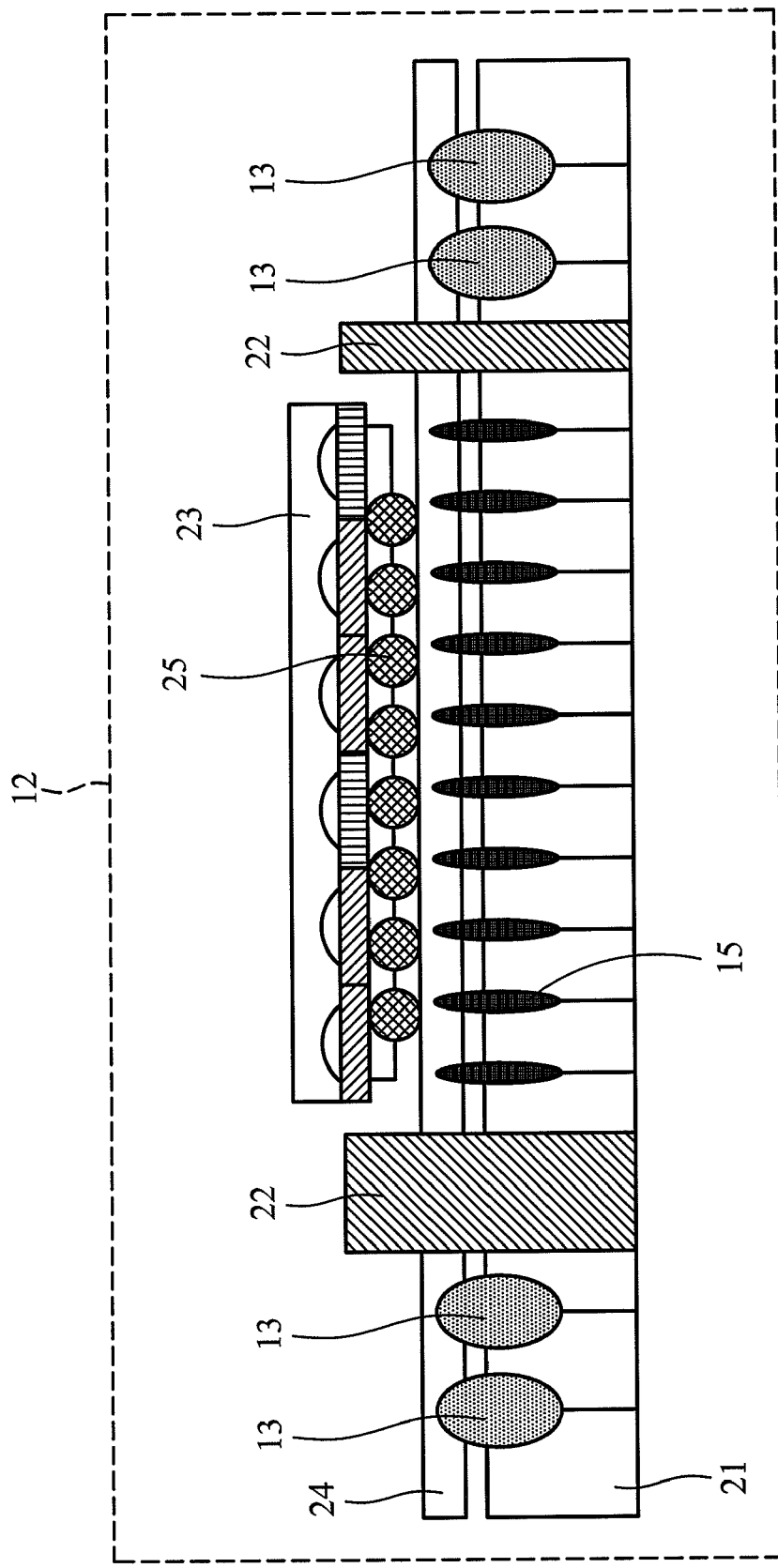
FIG. 2 is a cross section diagram of the chip tray in FIG. 1.

FIG. 2 is a cross section illustrating the chip tray of FIG. 1. The test unit 12 is disposed on a substrate 21, such as a printed circuit board (PCB). Insulation wall 22 forms the socket 16 for loading the chip 23. The chip 23 has a plurality of balled pins 25 to electrically contact the chip contact points 15. In this embodiment, the chip contact points 15 are contact pads, pogo pins or any similar pins. Before the chip 23 is loaded in the socket 16, an anisotropic conductive layer 24 is disposed on the chip contact points 15 to ensure that the chip contact points 15 electrically contact the balled pins 25.

Figure 3:
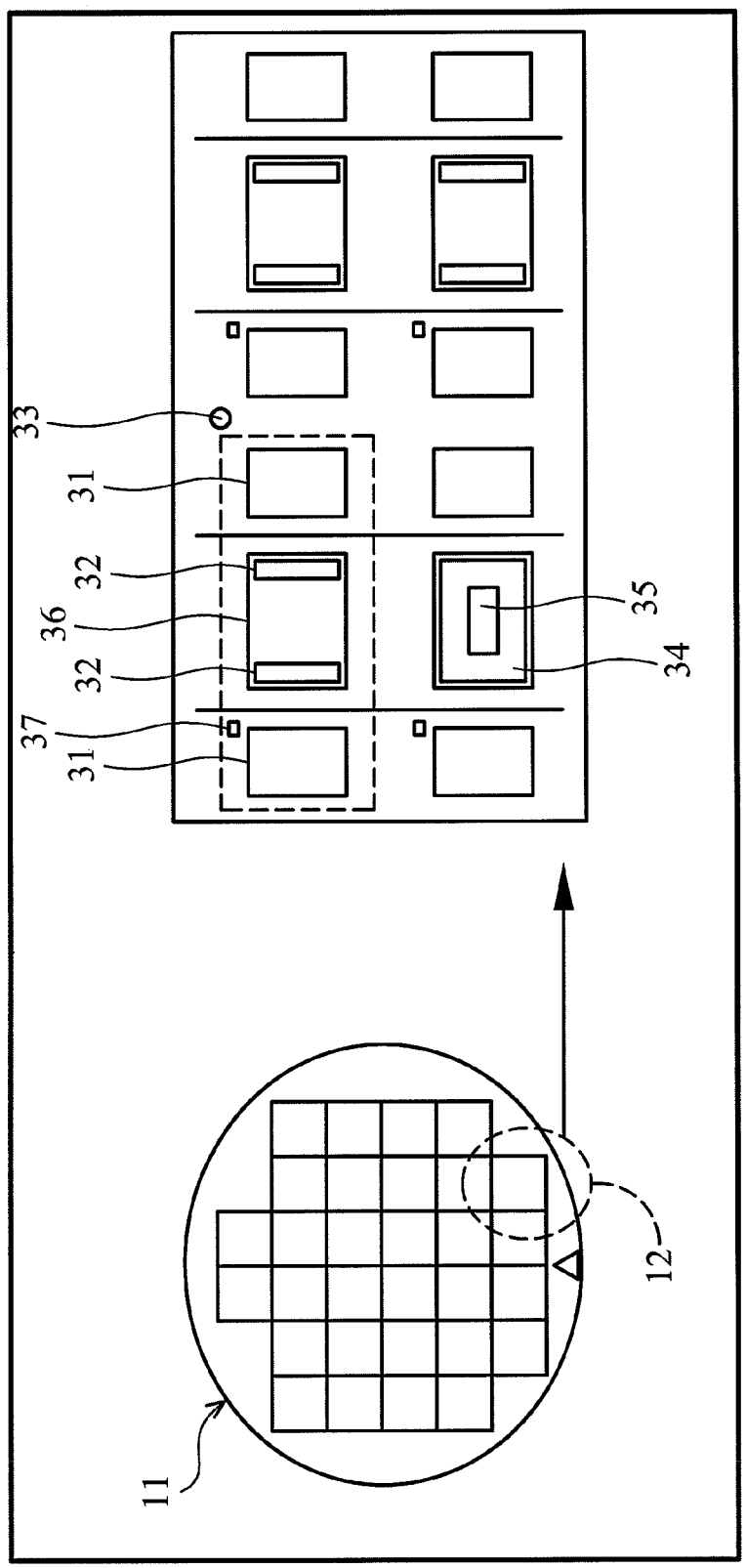
FIG. 3 is a schematic diagram showing another embodiment of a chip tray of the invention.

FIG. 3 is a schematic diagram showing another embodiment of a chip tray of the invention. The chip tray 11 comprises a plurality of test units 12 for loading and testing chips. In this embodiment, each test unit 12 comprises two extension contact areas 31, two chip contact areas 32 formed inside a chip socket 36, and a alignment point 37. The chip contact area 32 comprises a plurality contact points, such as the chip contact points 15 in FIG. 1, corresponding to extension contact points, such as the extension contact points 13 in FIG. 1, in extension contact areas 31. Furthermore, the location and arrangement of the chip contact area 32 is not limited to the described, those skilled in the art will recognize that the design the chip contact area 32 can be based on the chip package. The relationship between the extension contact points in the extension contact area 31 and the chip contact points in the chip contact area is one-to-one or many-to-one. The test unit 13 shows an image sensor chip 34 loaded on the chip socket of the test unit 13, and the image sensor window 35 detects the image based on the received light.

As described, a conductive layer, such as the anisotropic conductive layer 24 added between the socket and the chip, is utilized for better conductance between the socket and the chip, however, a cover plate is utilized to reduce risk.

Figure 4:
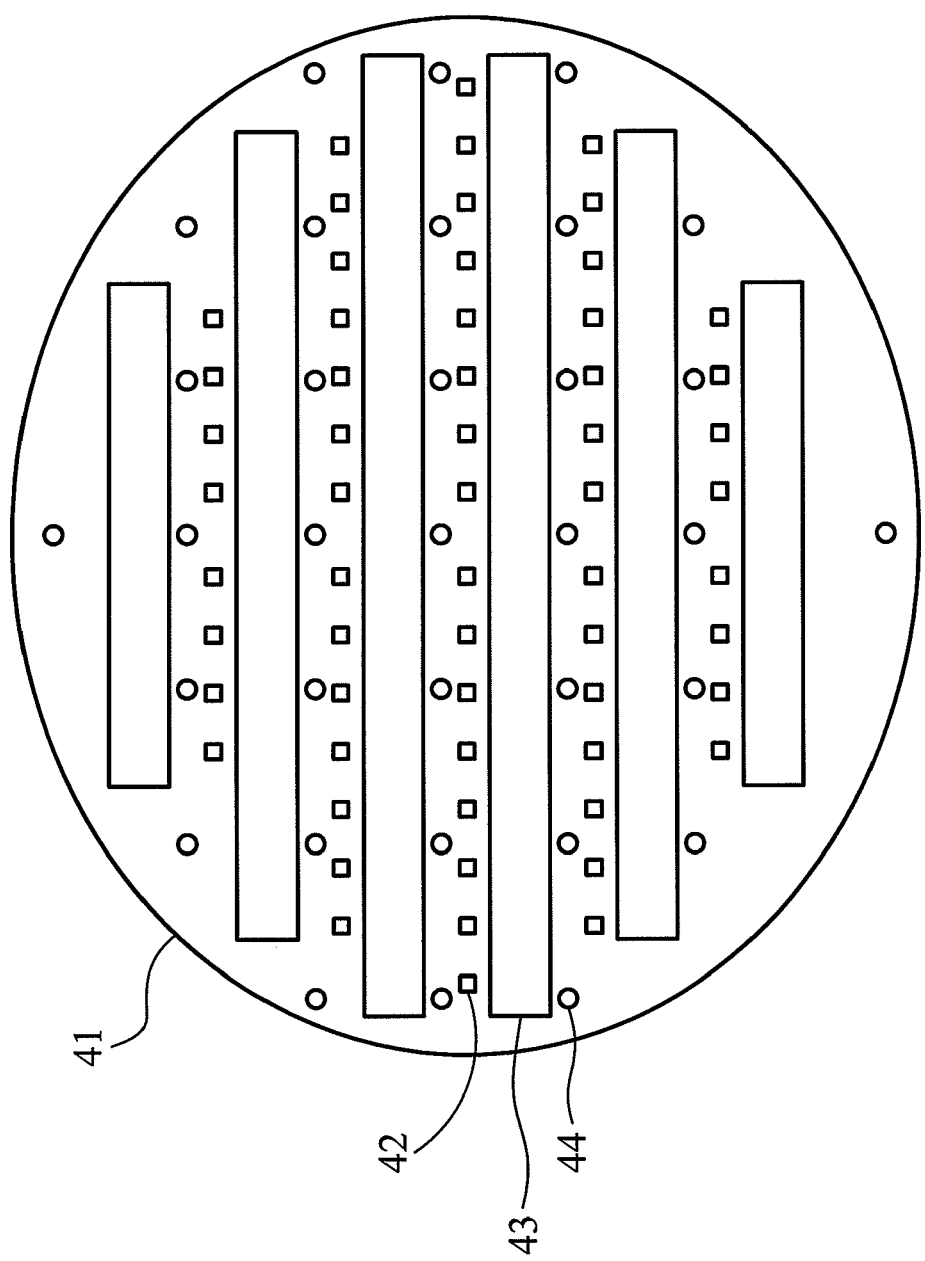
FIG. 4 is a schematic diagram of an embodiment of a cover plate of the invention.

FIG. 4 is a schematic diagram of an embodiment of a cover plate of the invention. In this embodiment, the cover plate 41 is for image sensor chips. The cover plate 41 comprises a plurality of image sensor windows 42, a plurality of slits 43 and fixing holes 44. The slit 43 exposes the extension contact points or area, such as extension contact area 31 in FIG. 3 and the extension contact points 13 in FIG. 1, to a probe card for chip testing. The image sensor hollow 42 exposes an image sensor window, such as the image sensor window 35 in FIG. 3, to a probe card for chip test. When the cover plate 41 is applied to fasten to chip tray, a fasten device, such as plug, screw or bolt, is applied through the fixing holes 44 and fixing hole of chip tray, such as fixing hole 33. In one preferred example, the cover plate 41 is made of insulating materials, such as plastic. In this embodiment, the cover plate 41 is made of opaque and insulating materials to prevent the image sensor window of the image sensor chip from receiving unwanted light. Moreover, if the testing chip is not an image sensor chip, the image sensor hollow 42 is not necessary.

Figure 5:
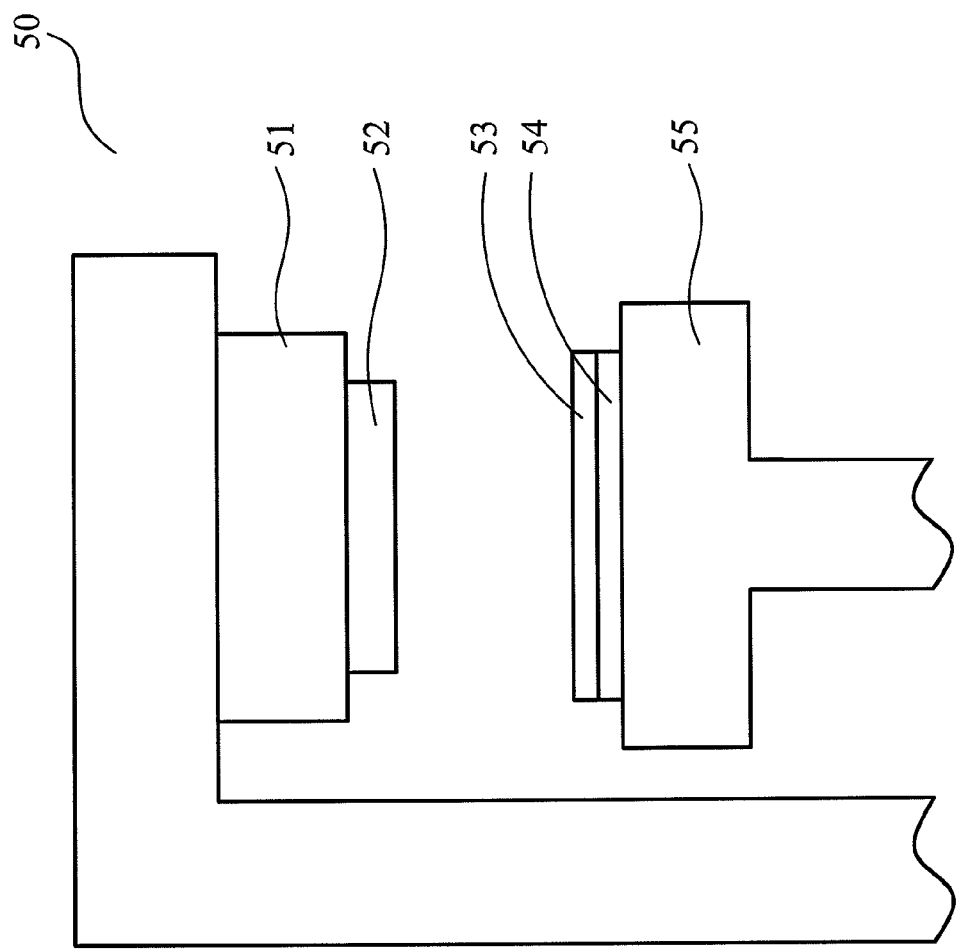
FIG. 5 is a schematic diagram of an embodiment of a chip test device of the invention.

FIG. 5 is a schematic diagram of an embodiment of a chip test device of the invention. The chip test device 50 comprises a test head 51, a probe card 52, and a carrier platform 55. The chip tray 54 and the cover plate 53 are placed and fastened on the carrier platform 55. The carrier platform 55 comprises a moving mechanism for moving the carrier platform 55 in the X-axis, Y-axis, Z-axis and .theta. axis. A coordinate table comprising all the coordinate values of the testing units in the chip tray 54 is applied for the moving mechanism. When the test head 51 begins testing, the carrier platform 55 moves based on a regular pattern and the test result from the probe card 52 and corresponding coordinate value is recorded by the test head. In this embodiment, the test head 51 and probe card 52 only move along the vertical axis, moreover, the test head 51 and probe card 52 further move in the X-axis, Y-axis, Z-axis and .theta. axis for reducing test time in another example. The carrier platform 55 has a fastening device or socket (not shown in FIG. 5) for fastening the chip tray 54 and the cover plate 53 thereon. The probe card 52 is customized based on the tested chip, and is operable for disassembly from the test head 51.

Figure 6A:
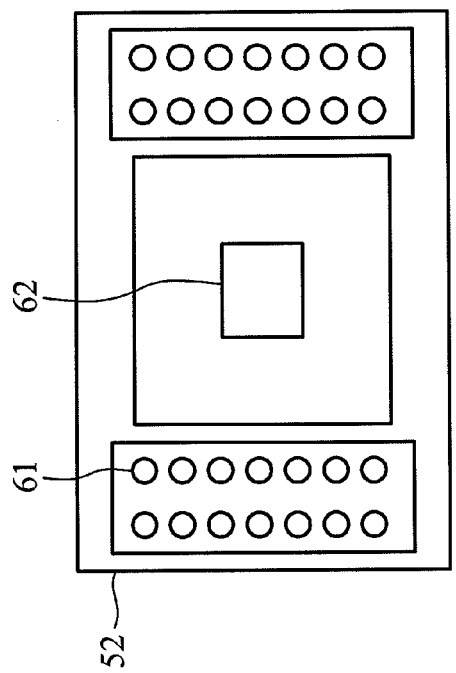
FIG. 6a is a schematic diagram of an embodiment of a probe card of the invention.

FIG. 6a is a schematic diagram of an embodiment of the probe card of the invention. The probe card 52 comprises a plurality of test contact points 61 and a light emitting device 62. In FIG. 6a, the probe card 52 is for the image sensor chip, such as the image sensor chip 34 described in FIG. 3, and if the probe card 52 is not for testing the image sensor chip, the light emitting device 62 is not necessary. The test contact points 61 electrically contacting the extension contact points of the test unit, such as the extension contact points 13 in FIG. 1, transmit test signals from the test head to the testing chip, and generate a test result based on the feedback signals from the testing chip. The test head 51 determines whether the testing chip has passed or failed based on the test result. In this embodiment, test contact point 61 is conductive pad, pogo pin, pin, ball pin or similar device.

Figure 6C:
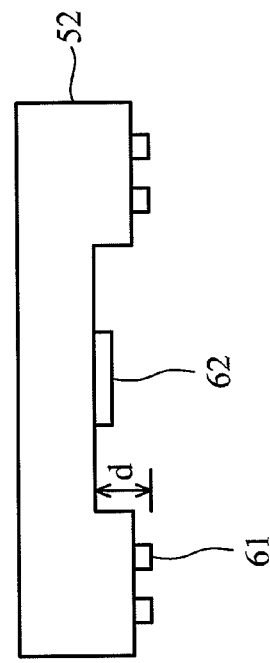
FIG. 6c is a cross section diagram of another embodiment of the probe card in FIG. 6.
Figure 6B:
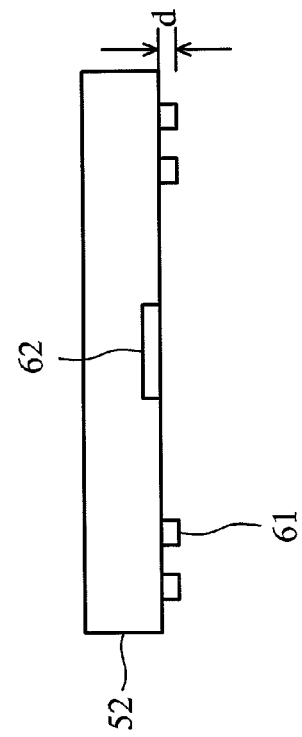
FIG. 6b is a cross section diagram of an embodiment of the probe card in FIG. 6.

Considering the thickness of the cover plate 53, the structures of two preferred embodiments of the probe card 52 are shown in FIGS. 6b and 6c. FIG. 6b is a cross section illustrating an embodiment of the probe card in FIG. 6. In FIG. 6b, the depth d of each test contact point 61 is slightly greater than the thickness of the cover plate 53. Thus, the test contact points 61 can be completely contact the extension contact points of the test unit. FIG. 6c is a cross section illustrating another embodiment of the probe card in FIG. 6. In FIG. 6c, the depth d of each test contact point 61 is slightly greater than the total thickness of the cover plate 53 and the light emitting device 62. The test contact points 61, can be retractable.

Figure 7:
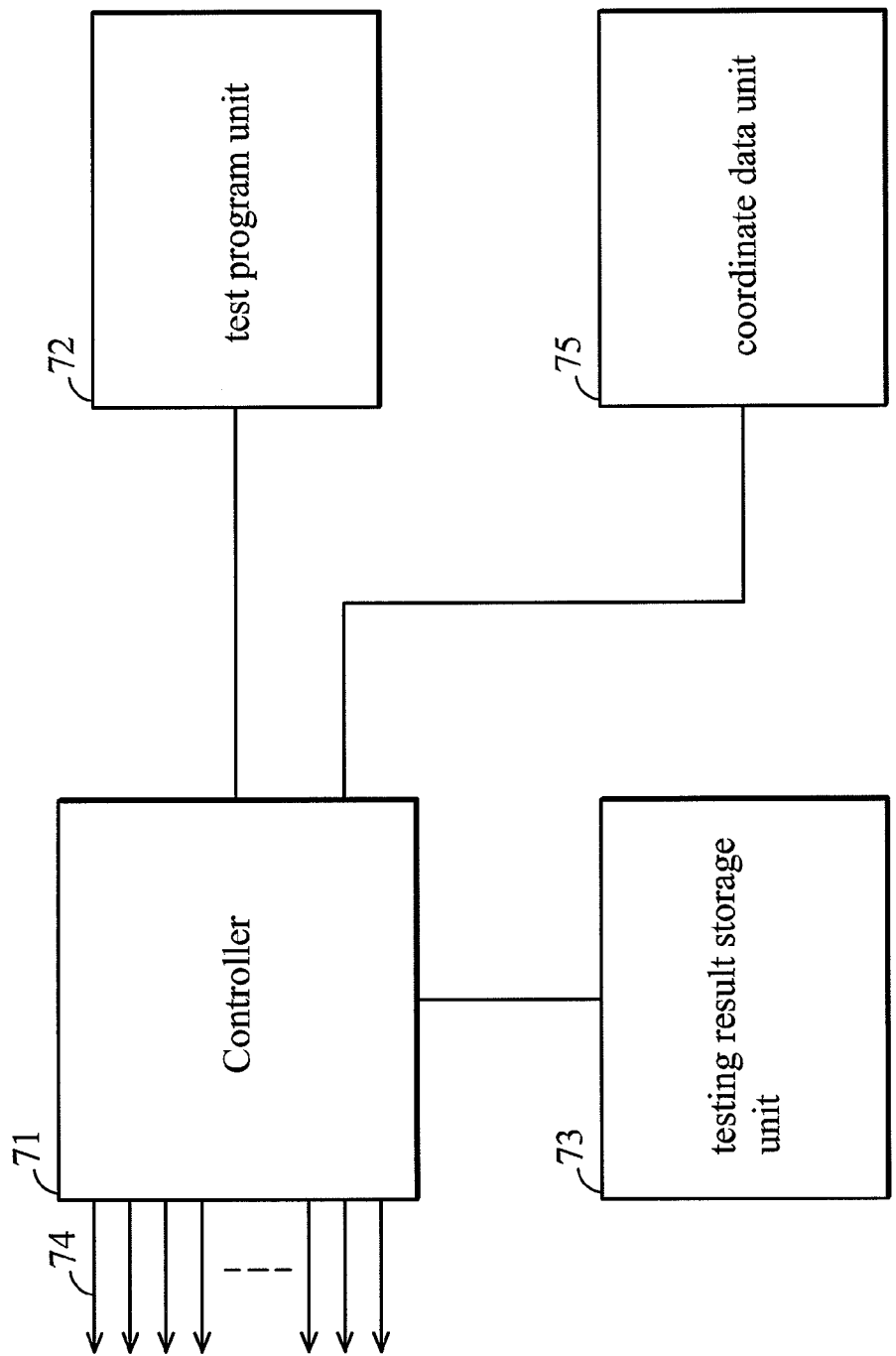
FIG. 7 is a block function diagram of an embodiment of a test head of the invention.

FIG. 7 is a block function diagram of an embodiment of a test head 51 in FIG. 5. The test head 51 comprises a controller 71 with a plurality of pins 74 corresponding to the test contact points 61, a test program unit 72, a testing result storage unit 73 and a coordinate data unit 75. The controller 71 transmits test signals via the pins 74 based on the test program from the test program unit 72 and the coordinate value from the coordinate data unit 75. The controller 71 then determines whether the testing chip has passed or failed based on received feedback signals, and generates and stores the test result in the testing result storage unit 73. The test result for the corresponding testing chip comprises the corresponding coordinate value. A computing device (not shown in FIG. 7), such as a computer are preferably controls the test program unit 72, the testing result storage unit 73 and the coordinate data unit 75.

Some embodiments of a chip test system require a pick-and-place device and a sorting machine. The pick-and-place device picks and places chips in a chip tray. When a chip tray is completely tested, the pick-and-place device transports another untested chip tray to the chip test device, such as chip test device 50 in FIG. 5. After a chip tray is completely tested, the test device transports the chip tray to a sorting machine. The sorting machine sorts the passed chips from the failed chips based on the test results.

Figure 8:
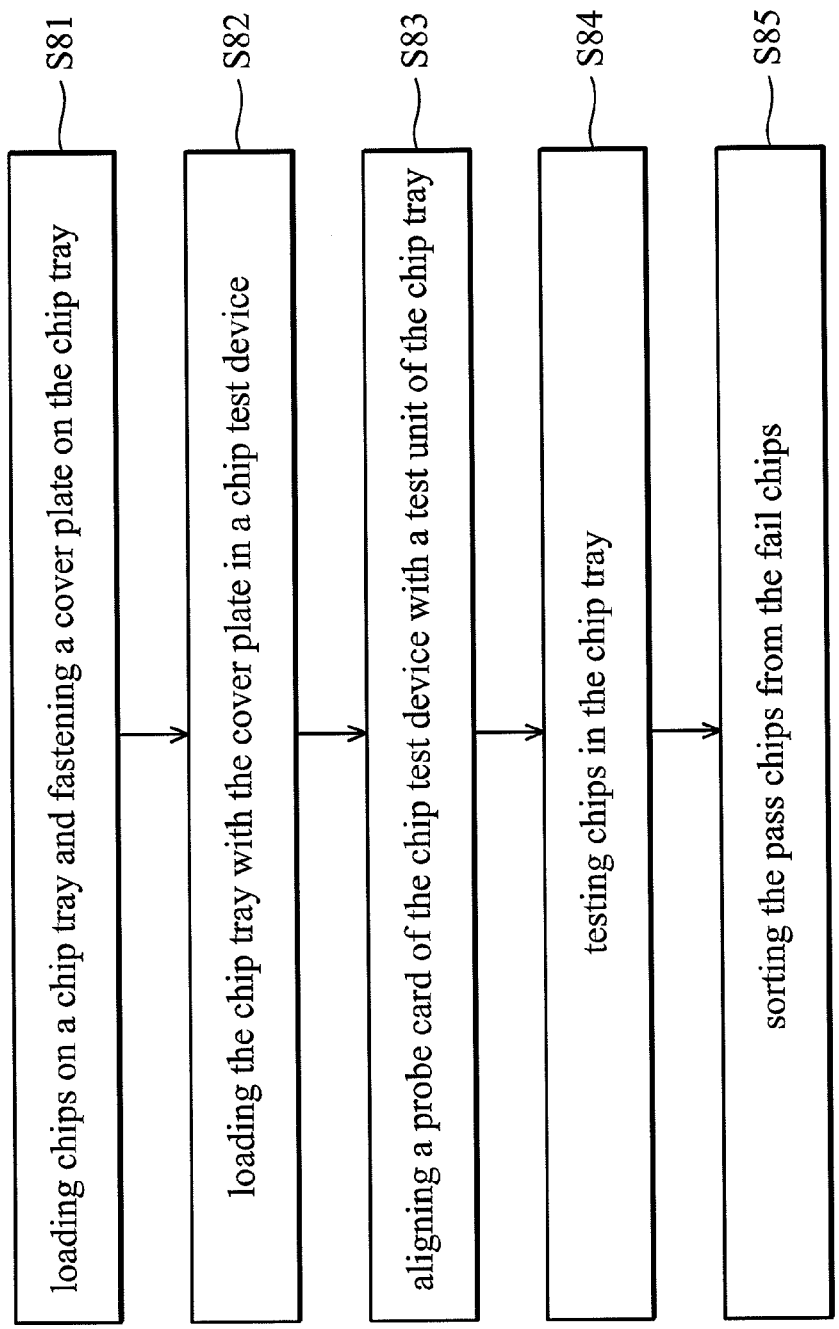
FIG. 8 is a flowchart of an embodiment of a chip test method of the invention.

FIG. 8 is a flowchart of an exemplary embodiment of a chip test method. In step S81, chips are loaded on a chip tray by a pick-and-place device, and the chip tray is then covered by a cover plate and transported to a chip test device in step S82. When a jig, and a chip tray covered by a cover plate, is transported to the chip test device, the test device aligns with the jig. The chip tray comprises a plurality of test units and each unit has an alignment contact point, the chip test device utilizes a probe card to align with the alignment contact point in step S83. After alignment, the chip test device starts to test all the chip of the chip tray in step S84. After testing, the chip test device records and transmits the test results to a sorting machine for sort the passed chips from the failed chips in step S85.

In this embodiment of the chip test method, the steps S81 and S85 can operate in different processes. In other words, a loading process is specialized for step S81 and a sorting process is specialized for step S85. In this way, the overall operating speed is increases and the performance is more efficient. For example, in one embodiment, the loading process is achieved by a pick-and-place device and the sorting process is achieved by a sorting device. The pick-and-place device, chip test device and the sorting machine can operate at respectively maximum speed. If the pick-and-place device finishes loading chips on the chip tray, the pick-and-place device enters a power-saving mode or is turned off. If the operating speed of the chip test device is faster than the speed of the pick-and-place device, the chip test device enters an idle mode or sleep mode until one chip tray is transported into the chip test device. If the operating speed of the chip test device is slower than the speed of the pick-and-place device, the completely loaded chip trays await sequential transport to the chip test device. If the operating speed of the chip test device is faster than the sorting speed of the sorting machine, the tested chip trays await sequential transport to the sorting machine. If the operating speed of the chip test device is slower than the sorting speed of the sorting machine, the sorting machine enters in an idle mode or sleep mode until a tested chip tray is transported into the sorting machine.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip test method, comprising:
    loading chips on a chip tray and fastening a cover plate on the chip tray;
    loading the chip tray with the cover plate in a chip test device;
    aligning a probe card of the chip test device with a test unit of the chip tray;
    testing chips in the chip tray;
    sorting the passed chips from the failed chips;
    forming a socket in the test unit for loading a first chip among the chips;
    forming a chip contact area in the test unit, wherein the chip contact area comprises a plurality of chip contact points for electrically contacting the first chip;
    forming an extension contact area in the test unit, wherein the extension contact area has a plurality of extension contact points corresponding to the chip contact points to direct test signals into the first chip and direct feedback signals out of the first chip;
    forming an alignment point in the test unit to provide an alignment location for the probe card; and
    forming an image sensor hollow in the cover plate for exposing an image sensor of the first chips to the probe card for testing.

2. The chip test method as claimed in claim 1, wherein when a jig, and the chip tray covered by the cover plate, is transported to the chip test device, the test device aligns with the jig.

3. The chip test method as claimed in claim 1, further comprising:
    disposing the chip contact area and the extension contact area on a first side of a first layer.

4. The chip test method as claimed in claim 1, further comprising:
    moving the chip tray to let the probe card to sequentially test the test units.

5. The chip test method as claimed in claim 1, further comprising:
    forming a plurality of slits in the cover plate, wherein the slits expose the extension contact area to the probe card for testing and fastened on the chip tray.

6. The chip test method as claimed in claim 1, further comprising:
    forming a plurality of fixing holes in the cover plate for fastening on the chip tray.

7. The chip test method as claimed in claim 1, wherein the steps of loading chips on the chip tray and sorting the passed chips from the failed chips are operated in different processes.

8. The chip test method as claimed in claim 1, wherein the step of loading chips on the chip tray is achieved by a pick-and-place device.

9. The chip test method as claimed in claim 8, wherein the step of sorting the passed chips from the failed chips is achieved by a sorting device.

10. The chip test method as claimed in claim 9, wherein the pick-and-place device and the sorting device operate at respectively maximum speed.

11. The chip test method as claimed in claim 9, wherein if the operating speed of the chip test device is faster than the sorting speed of the sorting device, the tested chip trays await sequential transport to the sorting device.

12. The chip test method as claimed in claim 9, wherein if the operating speed of the chip test device is lower than the sorting speed of the sorting device, the sorting device enters in an idle mode or a sleep mode until a tested chip tray is transported into the sorting device.

13. The chip test method as claimed in claim 8, wherein if the pick-and-place device finishes loading chips on the chip, tray, the pick-and-place device enters a power-saving mode.

14. The chip test method as claimed in claim 8, wherein if the pick-and-place device finishes loading chips on the chip, tray, the pick-and-place device is turned off.

15. The chip test method as claimed in claim 8, wherein if the operating speed of the chip test device is faster than the speed of the pick-and-place device, the chip test device enters an idle mode or a sleep mode until one chip tray is transported into the chip test device.

16. The chip test method as claimed in claim 8, wherein if the operating speed of the chip test device is slower than the speed of the pick-and-place device, the completely loaded chip trays await sequential transport to the chip test device.

* * * * *